(12) United States Patent
Laflaquiere et al.

(10) Patent No.: US 10,825,952 B2
(45) Date of Patent: Nov. 3, 2020

(54) COMBINING LIGHT-EMITTING ELEMENTS OF DIFFERING DIVERGENCE ON THE SAME SUBSTRATE

(71) Applicant: APPLE INC., Cupertino, CA (US)

(72) Inventors: Arnaud Laflaquiere, Singapore (SG); Marc Drader, Waterloo (CA)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/477,205

(22) PCT Filed: Jan. 11, 2018

(86) PCT No.: PCT/US2018/013230
§ 371 (c)(1),
(2) Date: Jul. 11, 2019

(87) PCT Pub. No.: WO2018/132521
PCT Pub. Date: Jul. 19, 2018

(65) Prior Publication Data
US 2019/0348819 A1 Nov. 14, 2019

Related U.S. Application Data

(60) Provisional application No. 62/446,533, filed on Jan. 16, 2017.

(51) Int. Cl.
*H01L 33/08* (2010.01)
*H01L 27/15* (2006.01)
(Continued)

(52) U.S. Cl.
CPC ............ *H01L 33/08* (2013.01); *H01L 27/156* (2013.01); *H01L 33/005* (2013.01); *H01L 33/465* (2013.01); *H01L 2933/0025* (2013.01)

(58) Field of Classification Search
None
See application file for complete search history.

(56) References Cited

U.S. PATENT DOCUMENTS

| 5,500,540 A | 3/1996 | Jewell et al. |
| 6,014,400 A | 1/2000 | Kobayashi |

(Continued)

FOREIGN PATENT DOCUMENTS

| CN | 1585217 A | 2/2005 |
| CN | 1632958 A | 6/2005 |

(Continued)

OTHER PUBLICATIONS

Park et al., U.S. Appl. No. 16/792,317, filed Feb. 17, 2020.
(Continued)

*Primary Examiner* — Cheung Lee
(74) *Attorney, Agent, or Firm* — Kligler & Associates Patent Attorneys Ltd

(57) ABSTRACT

An optoelectronic device includes a semiconductor substrate and a monolithic array of light-emitting elements formed on the substrate. The light-emitting elements include a first plurality of first emitters, configured to emit respective first beams of light with a first angular divergence, at respective first positions in the array, and a second plurality of second emitters, configured to emit respective second beams of light with a second angular divergence that is at least 50% greater than the first angular divergence, at respective second positions in the array.

20 Claims, 6 Drawing Sheets

(51) Int. Cl.
*H01L 33/00* (2010.01)
*H01L 33/46* (2010.01)

(56) References Cited

U.S. PATENT DOCUMENTS

| | | |
|---|---|---|
| 6,057,560 A | 5/2000 | Uchida |
| 6,201,825 B1 | 3/2001 | Sakurai et al. |
| 6,317,446 B1 | 11/2001 | Wipiejewski |
| 6,519,271 B2 | 2/2003 | Kwon et al. |
| 6,549,556 B1 | 4/2003 | Hwang et al. |
| 6,583,445 B1 | 6/2003 | Reedy et al. |
| 6,589,805 B2 | 7/2003 | Zhu et al. |
| 6,917,640 B2 | 7/2005 | Kwak |
| 7,215,692 B2 | 5/2007 | Jewell |
| 7,415,055 B2 | 8/2008 | Deng et al. |
| 8,520,114 B2 | 8/2013 | Cok et al. |
| 8,654,811 B2 | 2/2014 | Geske et al. |
| 9,036,956 B2 | 5/2015 | Tseng et al. |
| 9,038,883 B2 | 5/2015 | Wang et al. |
| 9,157,790 B2 | 10/2015 | Shpunt et al. |
| 9,389,069 B2 | 7/2016 | Bloom et al. |
| 9,692,211 B2 | 6/2017 | Matsubara et al. |
| 9,740,032 B2 | 8/2017 | Park et al. |
| 9,742,153 B1 | 8/2017 | Barve et al. |
| 9,825,425 B2 | 11/2017 | Mor |
| 9,865,994 B2 | 1/2018 | Matsubara et al. |
| 10,082,633 B2 | 9/2018 | Schaevitz et al. |
| 10,134,945 B1 | 11/2018 | Liu et al. |
| 10,325,894 B1 | 6/2019 | Pan |
| 2002/0075922 A1 | 6/2002 | Yoo et al. |
| 2002/0150130 A1 | 10/2002 | Coldren et al. |
| 2003/0169795 A1 | 9/2003 | Otoma et al. |
| 2003/0194168 A1 | 10/2003 | Ouchi |
| 2004/0099857 A1 | 5/2004 | Song et al. |
| 2004/0120376 A1 | 6/2004 | Kwak |
| 2005/0169343 A1 | 8/2005 | Ostermann et al. |
| 2005/0189551 A1 | 9/2005 | Peng et al. |
| 2006/0002444 A1 | 1/2006 | Wang et al. |
| 2006/0013276 A1 | 1/2006 | McHugo |
| 2006/0227836 A1 | 10/2006 | Omori et al. |
| 2007/0041411 A1 | 2/2007 | Pallec et al. |
| 2007/0091961 A1 | 4/2007 | Lin et al. |
| 2007/0120206 A1 | 5/2007 | Song et al. |
| 2009/0032908 A1 | 2/2009 | Masui et al. |
| 2009/0161713 A1 | 6/2009 | Duggan et al. |
| 2010/0029027 A1 | 2/2010 | Ikuta et al. |
| 2010/0203660 A1 | 8/2010 | Tanaka |
| 2010/0208764 A1* | 8/2010 | Otoma ............... H01S 5/04254 372/50.1 |
| 2011/0182314 A1 | 7/2011 | Yoshikawa et al. |
| 2013/0038881 A1 | 2/2013 | Pesach et al. |
| 2013/0075761 A1 | 3/2013 | Akiyama |
| 2013/0156060 A1 | 6/2013 | Futagawa et al. |
| 2013/0216247 A1 | 8/2013 | Oba et al. |
| 2013/0285115 A1 | 10/2013 | Wei et al. |
| 2013/0286614 A1 | 10/2013 | Tan et al. |
| 2014/0007935 A1 | 1/2014 | Multitu et al. |
| 2014/0211215 A1 | 7/2014 | Pesach et al. |
| 2015/0255955 A1 | 9/2015 | Wang et al. |
| 2015/0333047 A1 | 11/2015 | Pfeuffer |
| 2015/0340841 A1 | 11/2015 | Joseph |
| 2016/0377414 A1 | 12/2016 | Thuries et al. |
| 2017/0005455 A1 | 1/2017 | Padullaparth |
| 2017/0353012 A1 | 12/2017 | Barve et al. |
| 2018/0019302 A1 | 1/2018 | Deppe |
| 2018/0287345 A1 | 10/2018 | Laflaquiere et al. |
| 2019/0036308 A1 | 1/2019 | Carson et al. |
| 2019/0250257 A1 | 8/2019 | Finkelstein et al. |
| 2019/0305522 A1 | 10/2019 | Yuen et al. |
| 2019/0363520 A1 | 11/2019 | Laflaquiere et al. |

FOREIGN PATENT DOCUMENTS

| | | |
|---|---|---|
| CN | 101026211 A | 8/2007 |
| CN | 101447647 A | 6/2009 |
| CN | 101841129 A | 9/2010 |
| CN | 102354712 A1 | 2/2012 |
| CN | 103050063 A | 4/2013 |
| CN | 109378709 A | 2/2019 |
| CN | 110338815 A | 10/2019 |
| CN | 110739604 A | 1/2020 |
| EP | 0773614 A1 | 5/1997 |
| EP | 0887193 A1 | 12/1998 |
| EP | 0949728 A1 | 10/1999 |
| EP | 1418631 A2 | 5/2004 |
| EP | 1533876 A2 | 5/2005 |
| JP | 3236774 B2 | 12/2001 |
| JP | 2003121611 A | 4/2003 |
| JP | 2009094308 A | 4/2009 |
| KR | 20140061117 A | 5/2014 |
| WO | 2006003011 A1 | 1/2006 |
| WO | 2016122927 A1 | 8/2016 |

OTHER PUBLICATIONS

Li et al, U.S. Appl. No. 16/812,411, filed Mar. 9, 2020.
JP Application # 2019-515351 office action dated Feb. 10, 2020.
KR Application # 10-2019-7007363 office action dated Mar. 18, 2020.
EP Application # 17772843.3 office action dated Mar. 31, 2020.
International Application # PCT/US2020/18475 search report dated Apr. 17, 2020.
Lamy et al., "Design of an InGaAs/InP 1.55 µm electrically pumped VCSEL", Optical and Quantum Electronics, vol. 40, No. 14-15, pp. 1193-1198, Jun. 3, 2009.
Choquette et al., "Advances in Selective Wet Oxidation of AlGaAs Alloys", IEEE Journal of Selected Topics in Quantum Electronics ,vol. 3, issue 3, pp. 916-926, Jun. 1997.
Kumar et al., "Sacrificial etching of $Al_xGa_{1-x}As$ for III-V MEMS surface micromachining", Applied Physics A: Materials Science & Processing ,vol. 88, Issue 4, pp. 711-714, Sep. 2007.
Kim et al., "Lateral wet oxidation of $Al_xGa_{1-x}As$—GaAs depending on its structure", Applied Physics Letters 69, pp. 3357-3359, year 1996.
Pu et al.: "Hybrid Integration of VCSEL's to CMOS Integrated Circuits", IEEE Journal of Selected Topics in Quantum Electronics , vol. 5, No. 2, pp. 201-208, Mar./Apr. 1999.
Neff et al., "VCSEL/CMOS smart pixel arrays for free-space optical interconnects", Proceedings of the Third International Conference on Massively Parallel Processing Using Optical Interconnections, pp. 282-289, Oct. 27-29, 1996.
Matsuo et al., "Novel technology for hybrid integration of photonic and electronic circuits", IEEE Photonics Technology Letters , vol. 8, issue 11, pp. 1507-1509, Nov. 1996.
Liu, Y., "Heterogeneous Integration of OE Arrays With Si Electronics and Micro-optics", IEEE Transactions of Advanced Packaging, vol. 25, No. 1, pp. 43-49, Feb. 2002.
Talghader., "Integration of LEDs and VCSELs using fluidic self-assembly", SPIE Proceedings, vol. 3286, pp. 86-95, Jan. 28, 1998.
Lin et al., "Ultra-compact, high-yield intra-cavity contacts for GaAs/AlGaAs-based vertical-cavity surface-emitting lasers", Journal of Vacuum Science & Technology B, Nanotechnology and Microelectronics: Materials Processing, Measurement, and Phenomena, vol. 31, Section 1, pp. 011205-1-011205-6, Jan./Feb. 2013.
Sanchez et al., "Single-Mode Monolithic GaSB Vertical Cavity Surface-Emitting Laser", Optics Express, vol. 20, issue 14, pp. 15540-15546, year 2012.
Laflaquiere et al., U.S. Appl. No. 16/331,991, filed Nov. 3, 2019.
International Application # PCT/US2018/013230 Search Report dated Apr. 6, 2018.
CN Application # 201880007030.1 office action dated Jun. 3, 2020.
International Application # PCT/US2020/21631 search report dated Jun. 16, 2020.

* cited by examiner

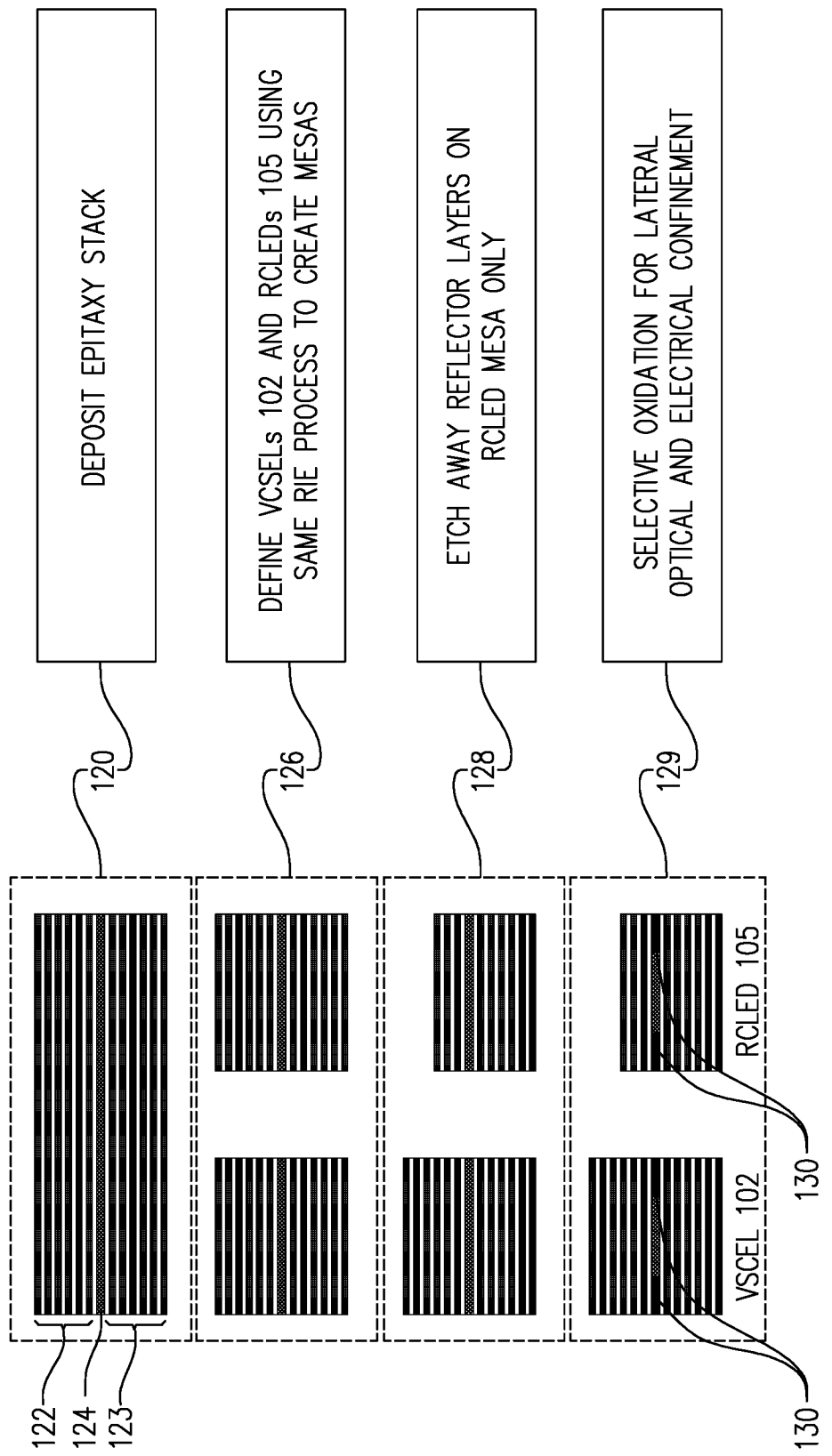

COMBINING LIGHT-EMITTING ELEMENTS OF DIFFERING DIVERGENCE ON THE SAME SUBSTRATE

FIELD OF THE INVENTION

The present invention relates generally to optoelectronic devices, and particularly to devices capable of emitting both patterned and flood illumination.

BACKGROUND

Various methods are known in the art for generating light sources based on arrays of multiple light-emitting elements of optical radiation on a monolithic semiconductor substrate. Some light sources comprising arrays of multiple light-emitting elements are based on monolithic arrays of vertical-cavity semiconductor lasers (VCSELs).

SUMMARY

Embodiments of the present invention that are described hereinbelow provide improved sources of illumination.

There is therefore provided, in accordance with an embodiment of the invention, an optoelectronic device, including a semiconductor substrate and a monolithic array of light-emitting elements formed on the substrate. The light-emitting elements include a first plurality of first emitters, configured to emit respective first beams of light with a first angular divergence, at respective first positions in the array, and a second plurality of second emitters, configured to emit respective second beams of light with a second angular divergence that is at least 50% greater than the first angular divergence, at respective second positions in the array.

In the disclosed embodiments, the first emitters include vertical-cavity surface-emitting lasers (VCSELs). In some embodiments, the second emitters include incoherent light-emitting elements, for example resonant-cavity light-emitting diodes (RCLEDs). In a disclosed embodiment, the VCSELs include first upper multilayer Bragg reflectors including a first number of mirror layers, and the RCLEDs include second upper multilayer Bragg reflectors including a second number of mirror layers, which is smaller than the first number.

Alternatively, the first emitters include first VCSELs, and the second emitters include second VCSELs. Typically, the first VCSELs have first optical apertures, and the second VCSELs have second optical apertures, which are smaller than the first optical apertures. In a disclosed embodiment, the first VCSELs include first mesas having a first width, and the second VCSELs include second mesas having a second width, which is smaller than the first width.

In some embodiments, the monolithic array includes an arrangement of mutually adjacent unit cells, wherein each unit cell includes a set of radiators capable of functioning as VCSELs, and wherein in at least some of the unit cells at least one of the radiators is converted to an incoherent light-emitting element. In a disclosed embodiment, the positions of the radiators in at least some of the unit cells are shifted as compared to the positions in the adjacent unit cells.

In the disclosed embodiments, the second positions are interspersed with the first positions in the array. Additionally or alternatively, the first positions form an uncorrelated pattern.

In some embodiments, the first emitters and the second emitters are coupled to be driven separately so that the device emits either or both of the first beams from the first emitters and the second beams from the second emitters. In one embodiment, the first beams emitted by the first emitters form a pattern of spots on a region in space, while the second beams cast flood illumination on the region.

There is also provided, in accordance with an embodiment of the invention, a method for producing an optoelectronic device. The method includes providing a semiconductor substrate and forming a monolithic array of light-emitting elements on the substrate. Forming the monolithic array includes forming a first plurality of first emitters, configured to emit respective first beams of light with a first angular divergence, at respective first positions in the array, and forming a second plurality of second emitters, configured to emit respective second beams of light with a second angular divergence that is at least 50% greater than the first angular divergence, at respective second positions in the array.

In the disclosed embodiments, forming the monolithic array of light-emitting elements includes defining in the monolithic array mutually adjacent unit cells and forming in each unit cell a set of radiators capable of functioning as vertical-cavity surface-emitting lasers (VCSELs), wherein each of the first emitters includes a respective one of the VCSELs, and forming the second plurality of the second emitters includes converting in at least some of the unit cells at least one of the radiators to serve as one of the second emitters.

In some embodiments, the VCSELs include Bragg reflectors including multiple layers, and converting the at least one of the radiators includes etching away at least some of the layers so as to convert the at least one of the radiators to a resonant-cavity light-emitting diode (RCLED).

Alternatively or additionally, converting the at least one of the radiators includes placing a diffractive optical element over the at least one of the radiators.

In another embodiment, the first and second emitters respectively include first and second VCSELs, wherein the first VCSELs have first optical apertures, and converting the at least one of the radiators includes etching the VCSELS so as to form in the second optical apertures, smaller than the first optical apertures, in the second VCSELs.

There is additionally provided, in accordance with an embodiment of the invention, an optoelectronic device, including a semiconductor substrate and a monolithic array of light-emitting elements formed on the substrate. The light-emitting elements include a first plurality of first emitters, configured to emit respective first beams of light with a first angular divergence to form a pattern of structured radiation on a region in space, at respective first positions in the array, and a second plurality of second emitters, configured to emit respective second beams of light with a second angular divergence that is greater than the first angular divergence to cast flood illumination on the region, at respective second positions in the array.

The present invention will be more fully understood from the following detailed description of the embodiments thereof, taken together with the drawings in which:

BRIEF DESCRIPTION OF THE DRAWINGS

FIGS. 4A-B are schematic sectional illustrations and flowcharts of two alternative techniques for fabricating an optoelectronic device, in accordance with embodiments of the invention.

DETAILED DESCRIPTION OF EMBODIMENTS

Arrays of VCSELs on a monolithic substrate may be used as sources for structured illumination. There arises in some applications a need to alternate between structured illumination and flood illumination. Adding a separate source of flood illumination to the source of structured illumination can increase the complexity, component count, and size of the illumination source, and increases the fabrication costs of the source.

Embodiments of the present invention address the drawbacks of a separate source of flood illumination by forming light-emitting elements different angular divergences in a single monolithic array. Specifically, in the embodiments that are described below, emitters of wider angular divergence are formed in available locations of an array of VCSELs while utilizing the same epitaxial structures that are fabricated for the array of VCSELs. Alternatively, the principles of the present invention may be applied in forming arrays of other sorts of light-emitting elements with varying divergences.

The elements of wider angular divergence may comprise incoherent light-emitting elements, or they may simply comprise VCELs of different dimensions, which give rise to more divergent beams. In either case, the wider-divergence light-emitting elements typically have an angular divergence that is at least 50% greater than that of the (narrow-divergence) VCSELs. In some embodiments, the elements of wider angular divergence provide flood illumination when powered, whereas powering the VCSELs (of narrower divergence) provides structured illumination.

Figure 1:
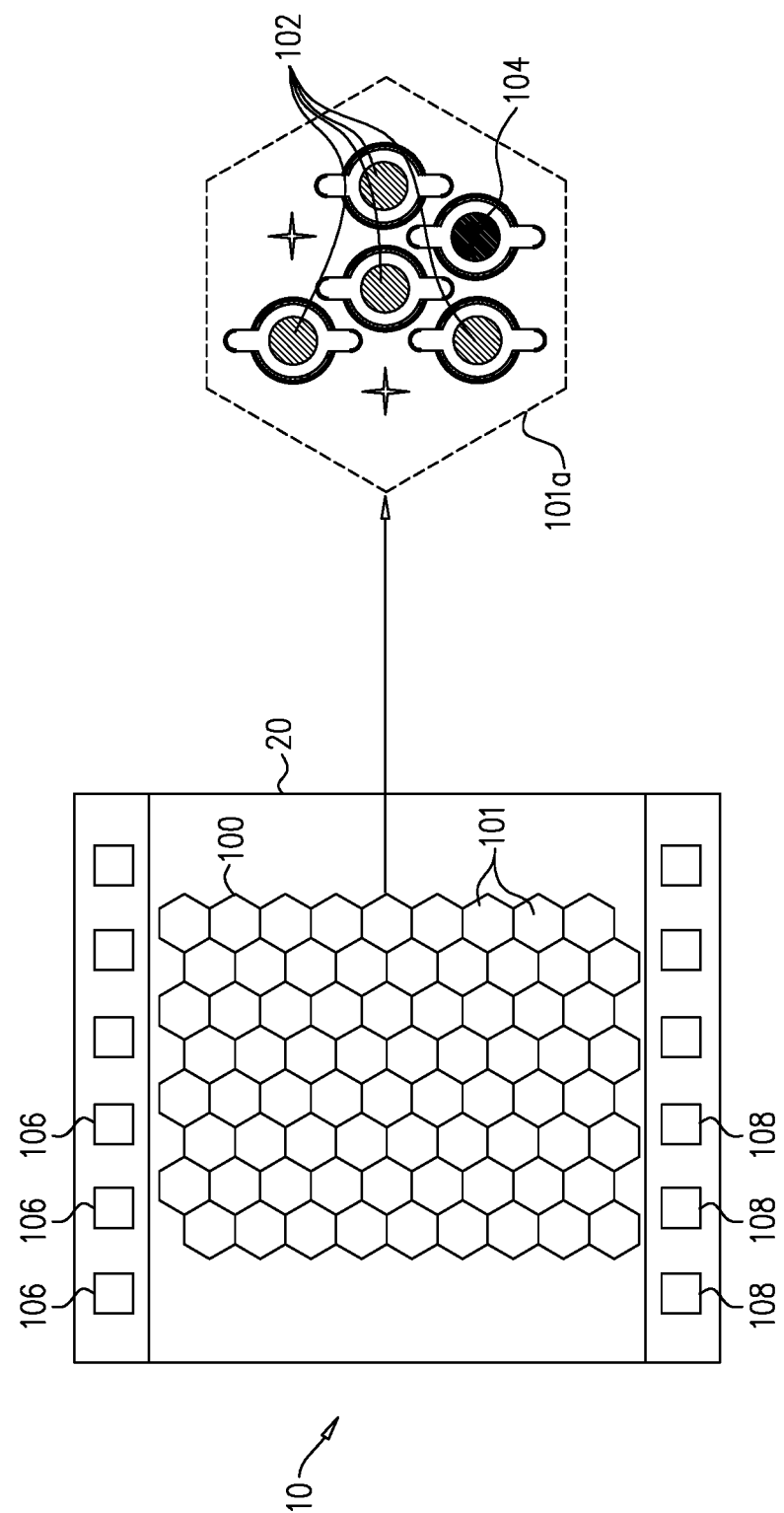
FIG. 1 is a schematic top view of an optoelectronic device, in accordance with an embodiment of the invention.

FIG. 1 shows a schematic top view of an optoelectronic device 10, in accordance with an embodiment of the invention. Optoelectronic device 10 comprises a semiconductor substrate in the form of a semiconductor die 20 comprising the light-emitting elements formed in unit cells 101, which in turn are arranged into an array 100. In the pictured embodiment, the light-emitting elements are formed in hexagonal unit cells 101, and array 100 forms a hexagonal lattice. Each unit cell 101 comprises VCSELs and incoherent light-emitting elements in varying numbers and locations, which will be further detailed in FIG. 2. A specific unit cell 101a is shown in an enlarged form next to semiconductor die 20. Specific unit cell 101a comprises four VCSELs 102 and one incoherent light-emitting element 104. By the term "incoherent" we refer here to light-emitting elements that are not coherent (as opposing to lasers that are coherent), regardless of the underlying structure.

Figure 5:
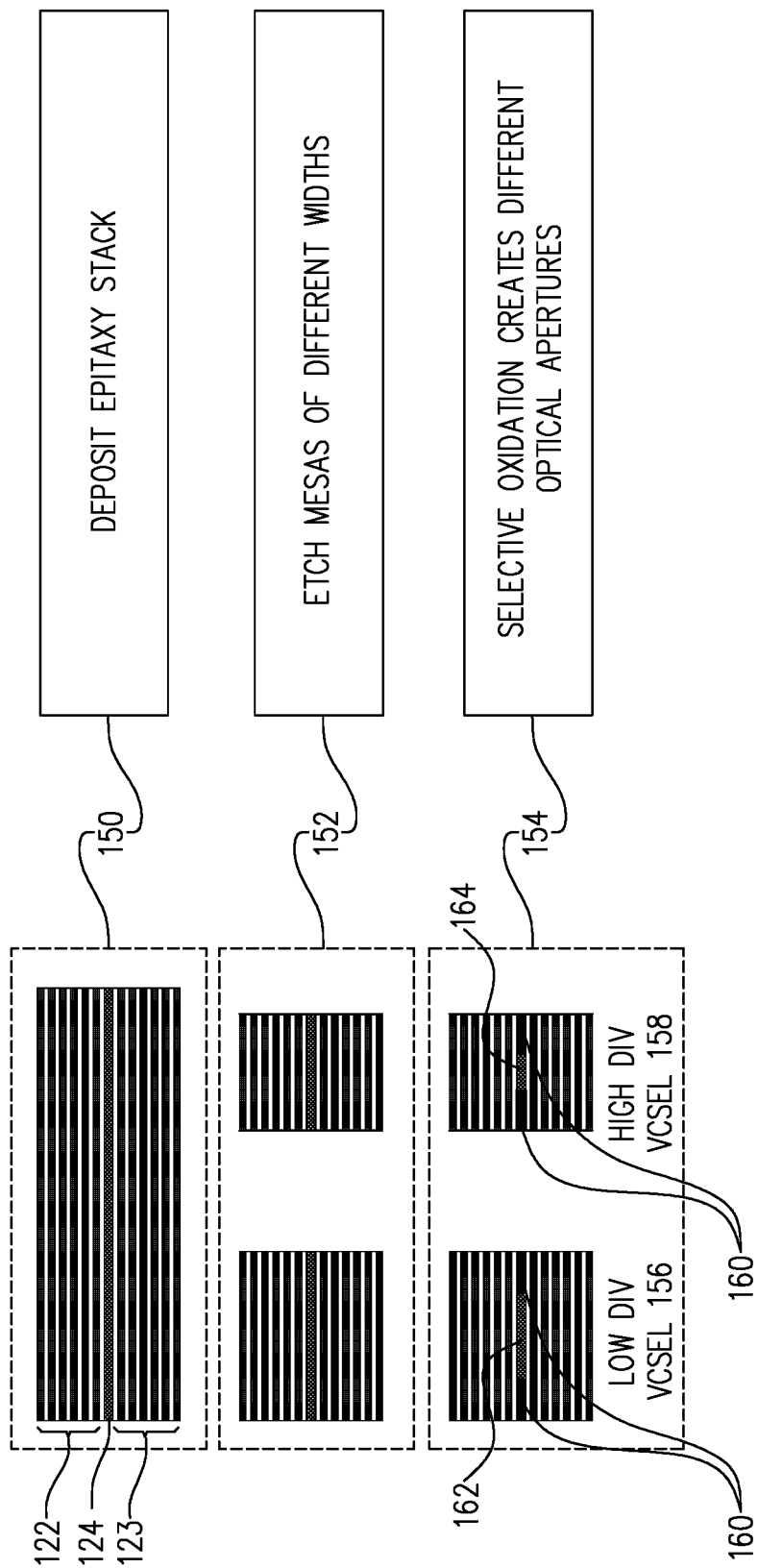
FIG. 5 is a flowchart with schematic sectional illustrations of another technique for fabricating an optoelectronic device, in accordance with an alternative embodiment of the invention.

In an alternative embodiment, shown in FIG. 5, incoherent light-emitting elements 104 are replaced by VCSELs of wider divergence than VCSELs 102. With the exception of the differences in the fabrication process of these wider-divergence VCSELs, which are explained in detail hereinbelow, the principles of the embodiments shown in FIGS. 1, 2 and 3A/B and the uses of incoherent light-emitting elements 104 in these embodiments may similarly be applied, mutatis mutandis, using such wider-divergence VCSELs.

Although the embodiment illustrated in FIG. 1 comprises hexagonal unit cells 101 in corresponding array 100, other embodiments of the present invention may use alternative unit cells (for example a square or an oblique parallelogram), and their corresponding arrays as are known from the theory of lattices.

VCSELs 102 and incoherent light-emitting elements 104 are formed on the semiconductor substrate by the same sort of photolithographic fabrication methods as are used to fabricate VCSEL arrays that are known in the art, with the addition of fabrication steps for differentiating between VCSELs 102 and incoherent light-emitting elements 104. These fabrication steps will be described below with reference to FIGS. 4A-B. The photolithographic fabrication methods comprise forming VCSELs 102 and incoherent light-emitting elements 104 with suitable thin film layer structures and forming conductors providing electric power and ground connections as well as signal connections between contact pads 106 and VCSELs 102 and between contact pads 108 and incoherent light-emitting elements 104, respectively.

The power and ground connections and associated controls can be implemented using an integrated backplane. For example, the emitters can be integrated with control circuits in a single chip, which is formed by bonding together a III-V semiconductor substrate, such as a GaAs wafer, on which the emitters (VCSELs and wide-divergence elements) are fabricated, with a silicon substrate on which control circuits for the emitters are fabricated, using a CMOS process, for instance.

Figure 2:
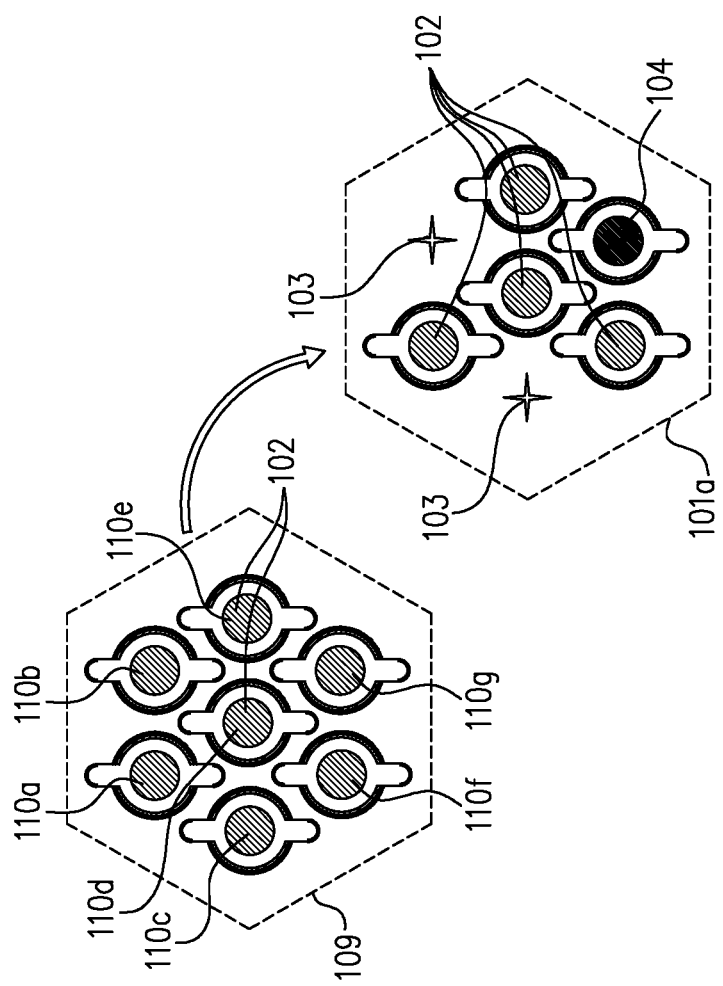
FIG. 2 is a schematic illustration of a design of an example unit cell, in accordance with an embodiment of the invention.

FIG. 2 is a schematic illustration of a design of specific unit cell 101a, in accordance with an embodiment of the invention. The basis for the design is a full unit cell 109 comprising seven VCSELs 102 in seven locations 110a-g, arranged in a hexagonal lattice within the full unit cell. The conversion of the design of full unit cell 109 to specific unit cell 101a comprises two parts:

1. VCSELs 102 in locations 110b and 110c are disabled by not providing conductors between these locations and contact pads 106. This generates inactive locations 103.
2. VCSEL 102 in location 110g is converted to incoherent light-emitting element 104 by removing some of the mirror layers at that location (which can be done according to one or more process steps, such as those described in reference to a reflector etch step 128 in FIG. 4A and a wet etch step 136 in FIG. 4B) and by connecting incoherent light-emitting element 104 to contact pads 108.

Specific unit cell 101a now comprises, as a result of the conversion from full cell 109, functioning VCSELs 102 in four locations: 110a, 110d, 110e, and 110f, as well as incoherent light-emitting element 104 in location 110g. Other unit cells 101 are similarly modified to have functioning VCSELs 102, but with the VCSELs in different locations, as well as possibly with a different number of functioning VCSELs, than in specific unit cell 101a.

It should be appreciated that the number and locations of VCSELs 102 and incoherent light-emitting elements 104 within the array (and any individual unit cells) may follow any desired pattern. In some instances, some or all unit cells may have VCSELs 102 and incoherent light-emitting elements 104 in the same locations. In other instances, the selection of which VCSELs 102 to remove and which to leave functioning in each unit cell 101 is performed in such a way that the resulting pattern of VCSELs on optoelectronic device 10 is uncorrelated. By "uncorrelated" we mean that, across optoelectronic device 10, the auto-correlation of the positions of VCSELs 102 as a function of transverse shift is insignificant for any shift larger than the size of a VCSEL. Random, pseudo-random, and quasi-periodic patterns are examples of such uncorrelated patterns. This kind of uncorrelated pattern of coherent light-emitting elements is useful for applications where illuminating a region in space with an uncorrelated distribution of light spots is desired, for example 3D mapping. Alternatively, depending on application requirements, any other suitable pattern of VCSELs, not necessarily uncorrelated, may be created using the principles described herein.

Culling VCSELs 102 for generating a pattern of coherent light-emitting elements, as described herein, can provide on each unit cell 101 at least one location for converting an unused VCSEL 102 into an incoherent light-emitting element 104, while at the same time benefiting from epitaxial layers and structures already fabricated for VCSELs 102. Alternatively, incoherent light-emitting elements may be formed only in some, but not all, of the unit cells in a monolithic array. Similarly, the number of incoherent light-emitting elements in a unit cell may vary between unit cells 101. As an example, some unit cells 101 may have a single incoherent light-emitting element 104 while other unit cells 101 may have two or more incoherent light-emitting elements.

In the pictured embodiment, unit cells 101 are designed in such a manner that VCSELs 102 and incoherent light-emitting elements 104 are typically (although not necessarily) interspersed, by which we mean that at least two of the nearest neighbors of each incoherent light-emitting element are VCSELs. Alternatively, the principles described herein may be applied in forming other arrangements of VCSELs and incoherent light-emitting elements.

In an alternative embodiment VCSELs 102 in full unit cell 109 are shifted slightly from their positions in the hexagonal lattice (much less than the separation between neighboring VCSELs 102), with the shifts varying between unit cells. These varying shifts further contribute to the generation of an uncorrelated pattern of VCSELs 102.

In some embodiments incoherent light-emitting elements 104 comprise resonant-cavity light-emitting diodes (RCLEDs). RCLEDs are advantageous in that, as compared to light-emitting diodes (LEDs), they exhibit a higher electrical-to-optical conversion efficiency, a smaller angle of divergence (but larger than that of VCSELs), and a narrower emission spectrum. In alternative embodiments certain VCSELs can be overlaid with a local DOE (diffractive optical element) to increase the beam divergence, so that these particular VCSELs serve as the incoherent light-emitting elements and thus create the desired flood illumination. In still other embodiments, other sorts of incoherent light-emitting elements may be formed together with the VCSELs in the array.

FIGS. 3-4 are schematic illustrations of embodiments of the present invention, wherein incoherent light-emitting elements 104 comprise RCLEDs.

Figure 3B:
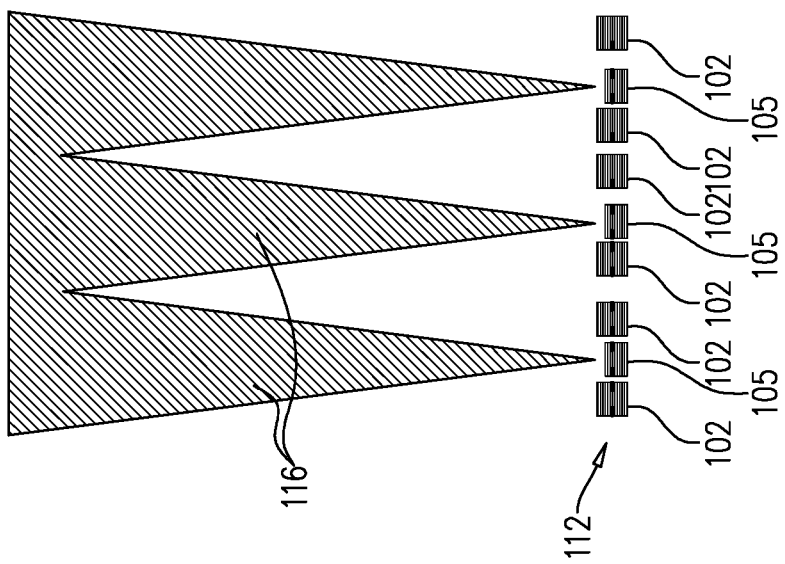
FIGS. 3A-B are partial cross-sections of an optoelectronic device, respectively illustrating patterned and flood radiation emitted by the device, in accordance with an embodiment of the invention.
Figure 3A:
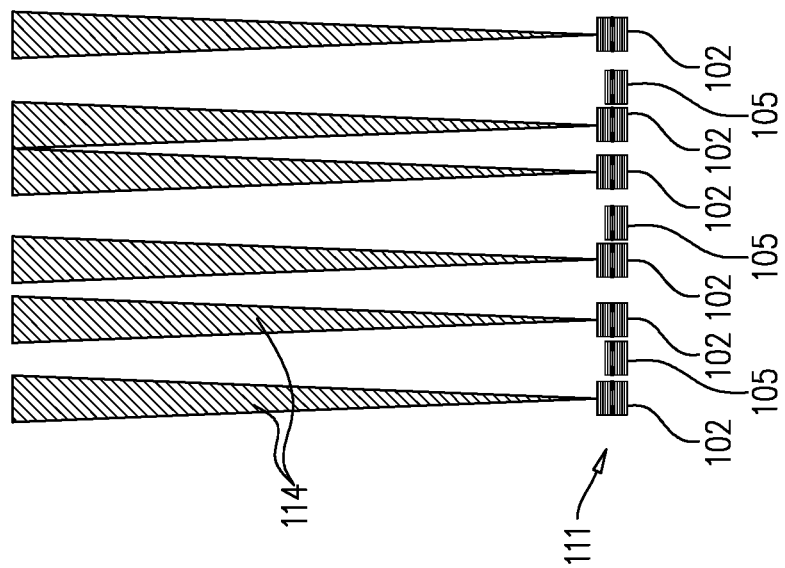

FIGS. 3A-B are schematic sectional illustrations of optoelectronic device 10, respectively illustrating patterned and flood radiation patterns emitted by the device, in accordance with an embodiment of the invention. Schematic sectional illustrations 111 and 112 illustrate the same section of optoelectronic device 10, but with different light-emitting elements powered. For the sake of clarity, VCSELs 102 and RCLEDs 105 are shown as if they were all in the plane of FIGS. 3A-B.

In FIG. 3A all VCSELs 102 are powered (but none of RCLEDs 105), and they emit narrow cones of light 114. A typical half-angle of the beam divergence of VCSELs 102 ranges from 10° to 15°; this kind of illumination is useful, inter alia, for structured illumination used in 3D mapping. A projection lens (not shown in the figures) may be used to collimate the beams so as to form a corresponding pattern of spots on a region in space.

In FIG. 3B all RCLEDs 105 are powered (but none of VCSELs 102), and they emit broad cones of light 116. The angular beam divergence of RCLEDs 105 may be tuned by selecting the number of mirror layers retained in an upper multilayer Bragg-reflector 122 in reflector etch step 128 in FIG. 4A and in wet etch step 136 in FIG. 4B. RCLEDs 105 (or alternatively, the wide-divergence VCSELs that are shown in FIG. 5) typically have an angular divergence that is at least 50% greater than that of VCSELs 102, and may be 100% greater, i.e., twice the angular divergence. For example, the half-angle of the beam divergence of RCLEDs 105 can range from 20° to 40°, in order to provide uniform flood illumination. This flood illumination can be cast on the same region in space as the pattern of spots formed by the VCSELs.

Although FIGS. 3A-B illustrate VCSELs 102 and RCLEDs 105 powered separately, other embodiments of the present invention provide both separate and simultaneous powering of the VCSELs and RCLEDs, thus having optoelectronic device 10 emitting either or both of coherent structured illumination and incoherent flood illumination.

Figure 4B:
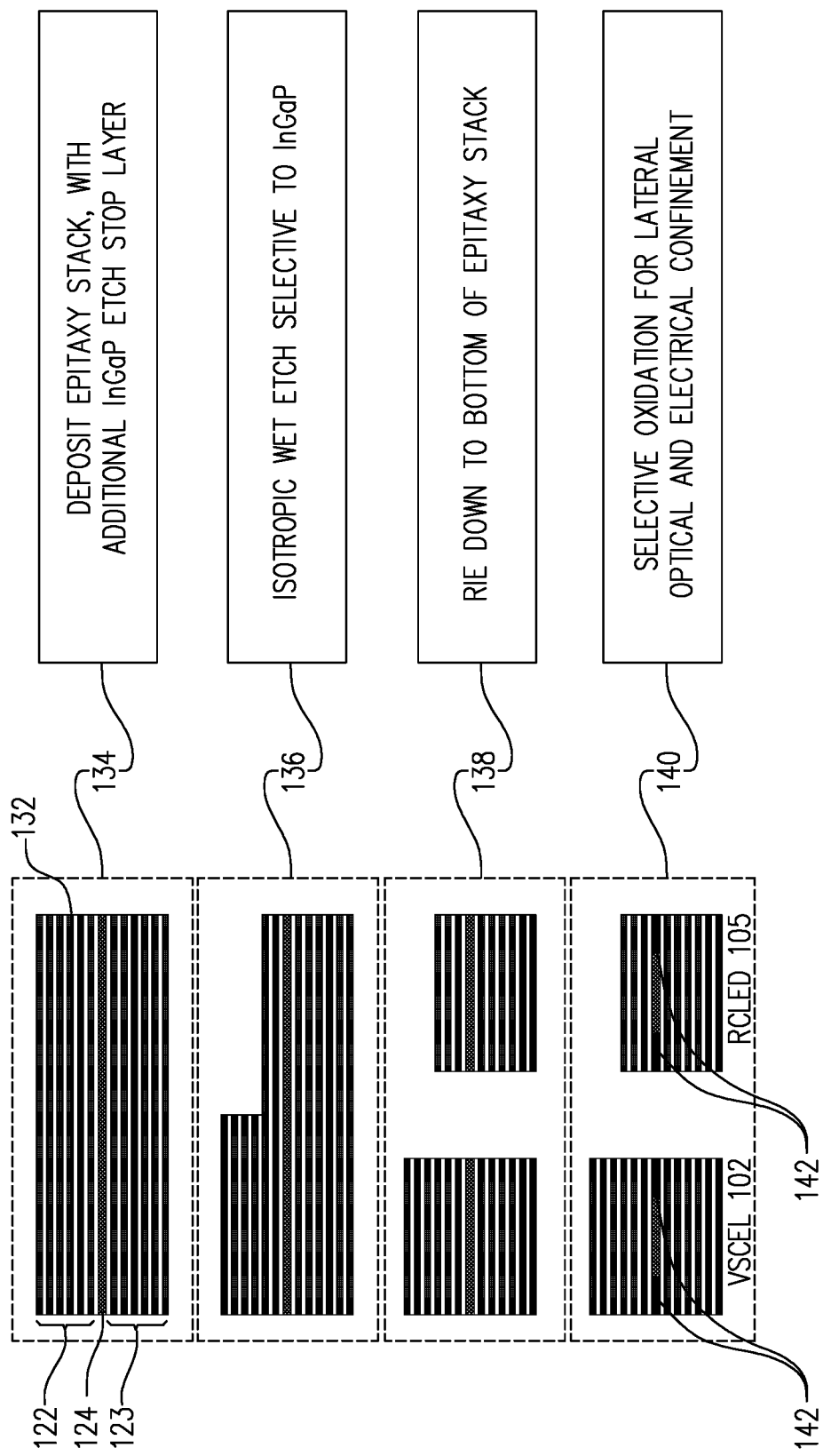

FIGS. 4A-B are schematic sectional illustrations and flowcharts of two alternative techniques for fabricating optoelectronic device 10, in accordance with embodiments of the invention. Each figure shows the fabrication of one VCSEL 102 and one neighboring RCLED 105. The left side of each figure presents sectional illustrations of the semiconductor stack during various steps of the fabrication, whereas the right side shows a flowchart of the fabrication steps. These illustrations show only those fabrication steps in which VCSELs 102 and RCLEDs 105 are differentiated from each other. Intermediate fabrication steps that are known to those skilled in the art of semiconductor fabrication, for example photoresist patterning, are omitted for the sake of simplicity.

The fabrication steps illustrated in FIG. 4A start at a starting step 120 with a VCSEL epitaxy stack, wherein upper multilayer Bragg-reflector 122, a lower multilayer Bragg-reflector 123, and a quantum well layer 124 have been fabricated using a standard epitaxial process. In a mesa etch step 126, VCSELs 102 and RCLEDs 105 are etched apart and defined in a single RIE (reactive-ion etching) step. In reflector etch step 128, a number of top reflector layers are etched away from upper multilayer Bragg-reflector 122 at the position of RCLED 105, leaving only 5-10 layers out of the original stack of 20-25 layers, for example. The number of layers etched is determined by the timing of the etch. This step reduces the reflectance of upper multilayer Bragg-reflector 122 sufficiently in order to convert a lasing VCSEL to a non-lasing RCLED, as indicated in the context of FIG. 2. As described above in reference to FIG. 3B, the number of remaining layers in upper multilayer Bragg-reflector 122 may also be used for tuning the angular divergence of RCLEDs 105. In a selective oxidation step 129, both VCSELs 102 and RCLEDs 105 are selectively oxidized in their lateral dimensions in locations 130 for achieving lateral optical and electrical confinement. Other fabrication options, for example ion-implantation or a combination of oxidation and ion-implantation, may be used for achieving lateral confinement.

The fabrication steps illustrated in FIG. 4B start at a starting step 134 with a VCSEL epitaxy stack, wherein upper multilayer Bragg-reflector 122, lower multilayer Bragg-reflector 123, and quantum well layer 124 have been fabricated using a standard epitaxial process. In addition, an InGaP (indium-gallium-phosphide) etch stop layer 132 has been added in the epitaxial process to the upper multilayer Bragg-reflector 122 in a selected position within the multilayer. In wet etch step 136, an isotropic wet etch, selective to InGaP etch stop layer 132, is performed. In wet etch step 136 a number of top reflector layers are etched away from upper multilayer Bragg-reflector 122 at the position of RCLED 105, similarly to reflector etch step 128 of FIG. 4A, with the etch terminating at etch stop layer 132. In a mesa etch step 138, a RIE is performed down to the bottom of lower multilayer Bragg-reflector 123 in order to define VCSELs 102 and RCLEDs 105. Similarly to selective oxidation step 129 of FIG. 4A, in a selective oxidation step 140 both VCSELs 102 and RCLEDs 105 are selectively oxidized in their lateral dimensions in locations 142 for achieving lateral optical and electrical confinement. As in FIG. 4A, other fabrication options, for example ion-implantation or a combination of oxidation and ion-implantation, may be used for achieving lateral confinement.

After each of the fabrication steps of FIGS. 4A-B, the production of optoelectronic device 10 continues using standard semiconductor fabrication steps which are known to those skilled in the art of semiconductor fabrication. Thus, device 10 can be formed with only minor modifications to standard processes that are known in the art for designing and fabricating VCSEL arrays.

FIG. 5 is a flowchart together with schematic sectional illustrations of another technique for fabricating optoelectronic device 10, in accordance with an alternative embodiment of the invention. In this case, as noted earlier, RCLEDs 105 are replaced by high-divergence VCSELs 158, which are fabricated alongside low-divergence VCSELs 156 (which are similar or identical to VCSELs 102 as described above). Low-divergence VCSELs 156 can be used to provide structured radiation, and high-divergence VCSELs 158 provide flood radiation, as explained above with reference to FIG. 3.

As in FIGS. 4A/B, the left side of FIG. 5 presents sectional illustrations of the semiconductor stack during successive steps of the fabrication, whereas the right side is a flowchart of the fabrication steps. These illustrations show only those fabrication steps in which VCSELs 156 and 158 are differentiated from one another other. Intermediate fabrication steps that are known to those skilled in the art of semiconductor fabrication, for example photoresist patterning, are omitted for the sake of simplicity.

The fabrication steps illustrated in FIG. 5 start with an epitaxial deposition step 150 to form a VCSEL epitaxy stack, including upper multilayer Bragg-reflector 122, lower multilayer Bragg-reflector 123, and quantum well layer 124 are fabricated using a standard epitaxial process. In a mesa etch step 152, VCSELs 156 and 158 are etched apart and defined, for example using RIE. The mesas of VCSELs 156 are etched to a substantially greater width than those of VCSELs 158, typically by appropriate definition of the mesa widths in the etch mask that is used at step 152. (The width is measured in a direction parallel to the substrate, meaning the horizontal direction in FIG. 5.) For instance, the mesas of VCSELs 156 may be etched to a width of 12 μm, while those of VCSELs 158 are etched to 11 μm or less.

In a selective oxidation step 154, both VCSELs 156 and 158 are selectively oxidized in their lateral dimensions in locations 160, for example using a wet oxidation process, in order to achieve lateral optical and electrical confinement. This selective oxidation leaves optical apertures 162 and 164 at the centers of the mesas. The oxidation process is applied to the mesas of both VCSELs 156 and 158 for the same length of time, with the result that apertures 164 of high-divergence VCSELs 158 are substantially smaller than apertures 162 of low-divergence VCSELs 156. Smaller apertures 164 give rise to wider beams from VCSELs 158, relative to the narrower beams emitted through apertures 162. The different widths of the VCSEL mesas can be chosen to yield the desired aperture sizes at step 154. Alternatively, other fabrication options, for example ion-implantation or a combination of oxidation and ion-implantation, may be used for achieving the desired aperture differences.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
    a semiconductor substrate; and
    a monolithic array of light-emitting elements formed on the substrate comprising epitaxial structures of multiple epitaxial layers, the light-emitting elements comprising:
        a first plurality of first emitters, configured to emit respective first beams of light with a first angular divergence, at respective first positions in the array, wherein the first emitters comprise vertical-cavity surface-emitting lasers (VCSELs); and
        a second plurality of second emitters, in which one or more of the epitaxial layers have been modified, relative to the first emitters, so that the second emitters emit respective second beams of light with a second angular divergence that is at least 50% greater than the first angular divergence, at respective second positions in the array, wherein the second emitters comprise incoherent light-emitting elements.

2. The optoelectronic device according to claim 1, wherein the incoherent light-emitting elements comprise resonant-cavity light-emitting diodes (RCLEDs).

3. The optoelectronic device according to claim 2, wherein the VCSELs comprise first upper multilayer Bragg reflectors comprising a first number of mirror layers, and the RCLEDs comprise second upper multilayer Bragg reflectors comprising a second number of mirror layers, which is smaller than the first number.

4. The optoelectronic device according to claim 1, wherein the second positions are interspersed with the first positions in the array.

5. The optoelectronic device according to claim 1, wherein the first positions form an uncorrelated pattern.

6. The optoelectronic device according to claim 1, wherein the first emitters and the second emitters are coupled to be driven separately so that the device emits either or both of the first beams from the first emitters and the second beams from the second emitters.

7. The optoelectronic device according to claim 6, wherein the first beams emitted by the first emitters form a pattern of spots on a region in space, while the second beams cast flood illumination on the region.

8. An optoelectronic device, comprising:
a semiconductor substrate; and
a monolithic array of light-emitting elements formed on the substrate comprising epitaxial structures of multiple epitaxial layers, the light-emitting elements comprising:
   a first plurality of first emitters, configured to emit respective first beams of light with a first angular divergence, at respective first positions in the array; and
   a second plurality of second emitters, in which one or more of the epitaxial layers have been modified, relative to the first emitters, so that the second emitters emit respective second beams of light with a second angular divergence that is at least 50% greater than the first angular divergence, at respective second positions in the array,
wherein the monolithic array comprises an arrangement of mutually adjacent unit cells, wherein each unit cell comprises a set of radiators capable of functioning as VCSELs, and wherein in at least some of the unit cells at least one of the radiators is converted to an incoherent light-emitting element by modification of the one or more of the epitaxial layers.

9. The optoelectronic device according to claim 8, wherein the first emitters comprise first VCSELs, and the second emitters comprise second VCSELs.

10. The optoelectronic device according to claim 9, wherein the first VCSELs have first optical apertures, and the second VCSELs have second optical apertures, which are smaller than the first optical apertures.

11. The optoelectronic device according to claim 10, wherein the first VCSELs comprise first mesas having a first width, and the second VCSELs comprise second mesas having a second width, which is smaller than the first width.

12. The optoelectronic device according to claim 8, wherein the positions of the radiators in at least some of the unit cells are shifted as compared to the positions in the adjacent unit cells.

13. The optoelectronic device according to claim 8, wherein the second positions are interspersed with the first positions in the array.

14. The optoelectronic device according to claim 8, wherein the first positions form an uncorrelated pattern.

15. The optoelectronic device according to claim 8, wherein the first emitters and the second emitters are coupled to be driven separately so that the device emits either or both of the first beams from the first emitters and the second beams from the second emitters.

16. A method for producing an optoelectronic device, the method comprising:

providing a semiconductor substrate; and
forming a monolithic array of light-emitting elements on the substrate, comprising:
   forming a first plurality of first emitters, configured to emit respective first beams of light with a first angular divergence, at respective first positions in the array; and
   forming a second plurality of second emitters, configured to emit respective second beams of light with a second angular divergence that is at least 50% greater than the first angular divergence, at respective second positions in the array,
wherein forming the monolithic array of light-emitting elements comprises defining in the monolithic array mutually adjacent unit cells, and forming in each unit cell a set of radiators capable of functioning as vertical-cavity surface-emitting lasers (VCSELs), wherein each of the first emitters comprises a respective one of the VCSELs, and forming the second plurality of the second emitters comprises converting in at least some of the unit cells at least one of the radiators to serve as one of the second emitters.

17. The method according to claim 16, wherein the VCSELs comprise Bragg reflectors comprising multiple layers, and wherein converting the at least one of the radiators comprises etching away at least some of the layers so as to convert the at least one of the radiators to a resonant-cavity light-emitting diode (RCLED).

18. The method according to claim 16, wherein the first and second emitters respectively comprise first and second VCSELs, wherein the first VCSELs have first optical apertures, and wherein converting the at least one of the radiators comprises etching the VCSELs so as to form second optical apertures, smaller than the first optical apertures, in the second VCSELs.

19. The method according to claim 16, wherein the second positions are interspersed with the first positions in the array.

20. An optoelectronic device, comprising:
a semiconductor substrate; and
a monolithic array of light-emitting elements formed on the substrate, the light-emitting elements comprising:
   a first plurality of first emitters, configured to emit respective first beams of light with a first angular divergence to form a pattern of structured radiation on a region in space, at respective first positions in the array, wherein the first emitters comprise vertical-cavity surface-emitting lasers (VCSELs); and
   a second plurality of second emitters, configured to emit respective second beams of light with a second angular divergence that is greater than the first angular divergence to cast flood illumination on the region, at respective second positions in the array, wherein the second emitters comprise incoherent light-emitting elements.

* * * * *